(12) United States Patent
Renn

(10) Patent No.: US 7,108,894 B2
(45) Date of Patent: Sep. 19, 2006

(54) DIRECT WRITE™ SYSTEM

(75) Inventor: Michael J. Renn, Albuquerque, NM (US)

(73) Assignee: Optomec Design Company, Albuquerque, NM (US)

( * ) Notice: Subject to any disclaimer, the term of this patent is extended or adjusted under 35 U.S.C. 154(b) by 278 days.

(21) Appl. No.: 10/072,605

(22) Filed: Feb. 5, 2002

(65) Prior Publication Data

US 2003/0048314 A1   Mar. 13, 2003

Related U.S. Application Data

(63) Continuation-in-part of application No. 10/060,960, filed on Jan. 30, 2002, now abandoned, which is a continuation-in-part of application No. 09/584,997, filed on Jun. 1, 2000, now Pat. No. 6,636,676, which is a continuation-in-part of application No. 09/408,621, filed on Sep. 30, 1999, now abandoned.

(60) Provisional application No. 60/102,418, filed on Sep. 30, 1998.

(51) Int. Cl.
  *C23C 14/30* (2006.01)
  *C23C 4/08* (2006.01)
  *B05D 11/08* (2006.01)
  *H05B 6/02* (2006.01)
  *B05B 5/00* (2006.01)

(52) U.S. Cl. ............... 427/596; 427/446; 427/455; 427/591; 118/641; 118/309; 118/621

(58) Field of Classification Search .......... 347/51, 347/83; 118/627, 300; 427/475, 421, 422, 427/561, 596, 180; 219/121.65, 121.66
See application file for complete search history.

(56) References Cited

U.S. PATENT DOCUMENTS

| 3,590,477 | A | 7/1971 | Cheroff et al. |
| 3,715,785 | A | 2/1973 | Brown et al. |
| 3,808,432 | A | 4/1974 | Ashkin |
| 3,808,550 | A | 4/1974 | Ashkin |

(Continued)

FOREIGN PATENT DOCUMENTS

EP     0 331 022 A2    9/1989

(Continued)

OTHER PUBLICATIONS

Ashkin, A., "Acceleration and Trapping of Particles by Radiation Pressure", *Physical Review Letters*, Jan. 26, 1970, pp. 156-159, vol. 24, No. 4, The American Physical Society.

(Continued)

*Primary Examiner*—Stephen Meier
*Assistant Examiner*—Julian D. Huffman
(74) *Attorney, Agent, or Firm*—Jeffrey D. Myers; Philip D. Askenazy; Peacock Myers, P.C.

(57) ABSTRACT

Methods and apparatus for the deposition of a source material (10) are disclosed. An atomizer (12) renders a supply of source material (10) into many discrete particles. A force applicator (14) propels the particles in continuous, parallel streams of discrete particles. A collimator (16) controls the direction of flight of the particles in the stream prior to their deposition on a substrate (18). In an alternative embodiment of the invention, the viscosity of the particles may be controlled to enable complex depositions of non-conformal or three-dimensional surfaces. The invention also includes a wide variety of substrate treatments which may occur before, during or after deposition. In yet another embodiment of the invention, a virtual or cascade impactor may be employed to remove selected particles from the deposition stream.

15 Claims, 17 Drawing Sheets

U.S. PATENT DOCUMENTS

Figure 1:
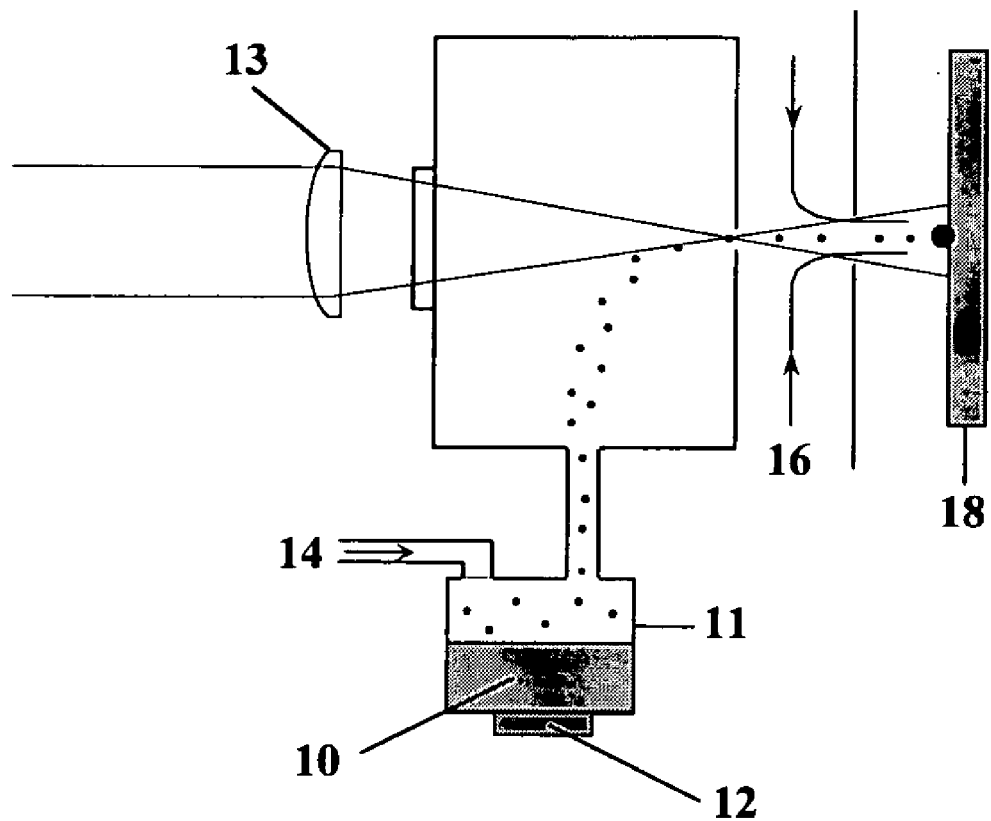
Figure 2:
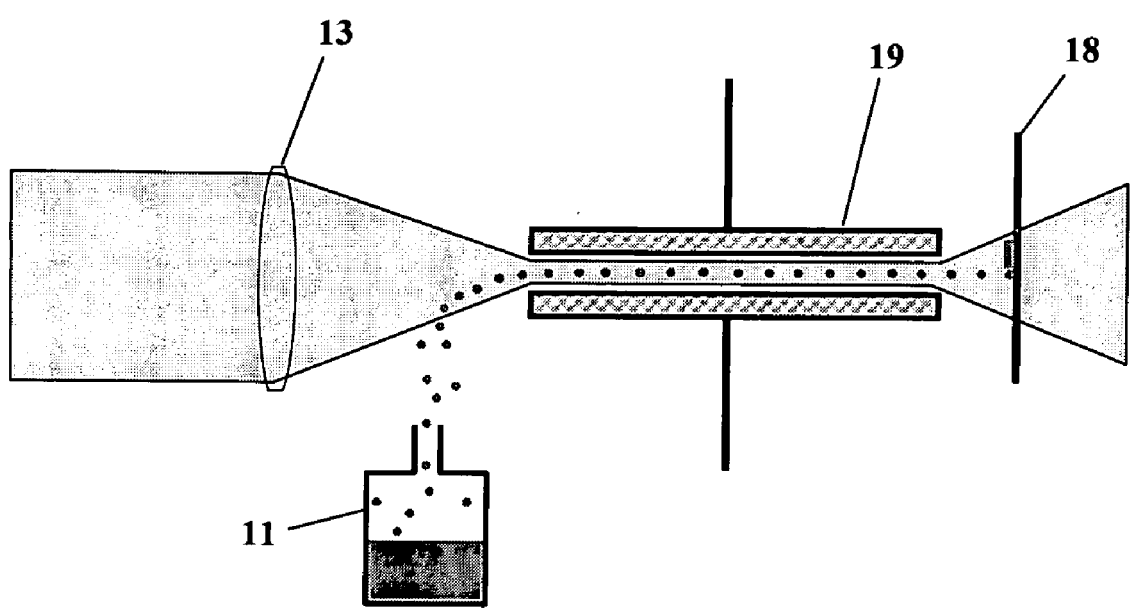

| | | | |
|---|---|---|---|
| 3,846,661 A | 11/1974 | Brown et al. | |
| 3,901,798 A | 8/1975 | Peterson | |
| 3,959,798 A | 5/1976 | Hochberg et al. | |
| 3,974,769 A | 8/1976 | Hochberg et al. | |
| 3,982,251 A | 9/1976 | Hochberg | |
| 4,016,417 A | 4/1977 | Benton | |
| 4,019,188 A | 4/1977 | Hochberg et al. | |
| 4,046,073 A | 9/1977 | Mitchell et al. | |
| 4,046,074 A | 9/1977 | Hochberg et al. | |
| 4,092,535 A | 5/1978 | Ashkin et al. | |
| 4,112,437 A | 9/1978 | Mir et al. | |
| 4,200,669 A | 4/1980 | Schaefer et al. | |
| 4,228,440 A | 10/1980 | Horike et al. | |
| 4,269,868 A | 5/1981 | Livsey | |
| 4,323,756 A | 4/1982 | Brown et al. | |
| 4,453,803 A | 6/1984 | Hidaka et al. | |
| 4,485,387 A | 11/1984 | Drumheller | |
| 4,497,692 A * | 2/1985 | Gelchinski et al. | 427/596 |
| 4,670,135 A | 6/1987 | Marple et al. | |
| 4,689,052 A * | 8/1987 | Ogren et al. | 95/291 |
| 4,825,299 A | 4/1989 | Okada et al. | |
| 4,826,583 A * | 5/1989 | Biernaux et al. | 204/224 R |
| 4,893,886 A | 1/1990 | Ashkin et al. | |
| 4,904,621 A | 2/1990 | Loewenstein et al. | |
| 4,947,463 A | 8/1990 | Matsuda et al. | |
| 4,997,809 A | 3/1991 | Gupta | |
| 5,032,850 A | 7/1991 | Andeen et al. | |
| 5,043,548 A | 8/1991 | Whitney et al. | |
| 5,164,535 A | 11/1992 | Leasure | |
| 5,170,890 A | 12/1992 | Wilson et al. | |
| 5,182,430 A | 1/1993 | Lagain | |
| 5,194,297 A | 3/1993 | Scheer et al. | |
| 5,208,431 A | 5/1993 | Uchiyama et al. | |
| 5,254,832 A | 10/1993 | Gartner et al. | |
| 5,292,418 A * | 3/1994 | Morita et al. | 427/597 |
| 5,335,000 A | 8/1994 | Stevens | |
| 5,366,559 A | 11/1994 | Periasamy | |
| 5,378,505 A | 1/1995 | Kubota et al. | |
| 5,378,508 A | 1/1995 | Castro et al. | |
| 5,403,617 A | 4/1995 | Haaland | |
| 5,449,536 A | 9/1995 | Funkhouser et al. | |
| 5,486,676 A | 1/1996 | Aleshin | |
| 5,495,105 A | 2/1996 | Nishimura et al. | |
| 5,512,745 A | 4/1996 | Finer et al. | |
| 5,607,730 A | 3/1997 | Ranalli | |
| 5,612,099 A * | 3/1997 | Thaler | 427/565 |
| 5,614,252 A | 3/1997 | McMillan et al. | |
| 5,648,127 A | 7/1997 | Turchan et al. | |
| 5,733,609 A | 3/1998 | Wang et al. | |
| 5,736,195 A | 4/1998 | Haaland | |
| 5,770,272 A | 6/1998 | Biemann et al. | |
| 5,772,106 A | 6/1998 | Ayers et al. | |
| 5,814,152 A * | 9/1998 | Thaler | 118/641 |
| 5,854,311 A | 12/1998 | Richart | |
| 5,940,099 A | 8/1999 | Karlinski | |
| 5,958,268 A | 9/1999 | Engelsberg et al. | |
| 5,980,998 A | 11/1999 | Sharma et al. | |
| 5,993,549 A | 11/1999 | Kindler et al. | |
| 6,007,631 A | 12/1999 | Prentice et al. | |
| 6,015,083 A | 1/2000 | Hayes et al. | |
| 6,025,037 A | 2/2000 | Wadman et al. | |
| 6,110,144 A | 8/2000 | Choh et al. | |
| 6,116,718 A | 9/2000 | Peeters et al. | |
| 6,136,442 A | 10/2000 | Wong | |
| 6,151,435 A | 11/2000 | Pilloff | |
| 6,159,749 A | 12/2000 | Liu | |
| 6,182,688 B1 | 2/2001 | Fabre | |
| 6,251,488 B1 | 6/2001 | Miller et al. | |
| 6,258,733 B1 | 7/2001 | Solayappan et al. | |
| 6,265,050 B1 | 7/2001 | Wong et al. | |
| 6,290,342 B1 | 9/2001 | Vo et al. | |
| 6,291,088 B1 | 9/2001 | Wong et al. | |
| 6,293,659 B1 | 9/2001 | Floyd et al. | |
| 6,340,216 B1 | 1/2002 | Peeters et al. | |
| 6,348,687 B1 * | 2/2002 | Brockmann et al. | 250/251 |
| 6,379,745 B1 | 4/2002 | Kydd et al. | |
| 6,406,137 B1 | 6/2002 | Okazaki et al. | |
| 6,416,156 B1 | 7/2002 | Noolandi et al. | |
| 6,416,157 B1 | 7/2002 | Peeters et al. | |
| 6,416,158 B1 | 7/2002 | Floyd et al. | |
| 6,416,159 B1 | 7/2002 | Floyd et al. | |
| 6,454,384 B1 | 9/2002 | Peeters et al. | |
| 6,467,862 B1 | 10/2002 | Peeters et al. | |
| 6,481,074 B1 | 11/2002 | Karlinski | |
| 6,503,831 B1 | 1/2003 | Speakman | |
| 6,544,599 B1 | 4/2003 | Brown et al. | |
| 6,548,122 B1 | 4/2003 | Sharma et al. | |
| 6,573,491 B1 | 6/2003 | Marchitto et al. | |
| 2002/0012743 A1 | 1/2002 | Sampath et al. | |
| 2002/0132051 A1 | 9/2002 | Choy | |
| 2003/0175411 A1 | 9/2003 | Kodas et al. | |
| 2003/0219923 A1 | 11/2003 | Arokia et al. | |
| 2004/0179808 A1 | 9/2004 | Renn | |

FOREIGN PATENT DOCUMENTS

| | | |
|---|---|---|
| EP | 0 444 550 A2 | 9/1991 |

OTHER PUBLICATIONS

Ashkin, A., et al., "Optical trapping and manipulation of single cells using infrared laser beams", *Nature*, 24/31 Dec. 1987, pp. 769-771, vol. 330, London, Great Britain.

Lewandowski, H.J., et al., "Laser Guiding of Microscopic Particles in Hollow Optical Fibers", *Announcer 27*, Summer Meeting—Invited and Contributed Abstracts, Jul. 1997, p. 89.

Marple, V.A., et al., "Inertial, Gravitational, Centrifugal, and Thermal Collection Techniques", *Aerosol Measurement: Principles, Techniques and Applications*, 2001, pp. 229-260, Wiley-Interscience, New York, N.Y.

Odde, D.J., et al., "Laser-Based Guidance of Cells Through Hollow Optical Fibers", *The American Society for Cell Biology Thirty-Seventh Annual Meeting*, Dec. 17, 1997.

Odde, D.J., et al., "Laser-guided direct writing for applications in biotechnology", *Trends in Biotechnology*, Oct. 1999, pp. 385-389, vol. 17, Elsevier Trend Journals, Cambridge, U.K.

Renn, M.J., et al., "Evanescent-wave guiding of atoms in hollow optical fibers", *Physical Review A*, Feb. 1996, pp. R648-R651, vol. 53, No. 2, The American Physical Society.

Renn, M.J., et al., "Laser-Guided Atoms in Hollow-Core Optical Fibers", *Physical Review Letters*, Oct. 30, 1995, pp. 3253-3256, vol. 75, No. 18, The American Physical Society.

Renn, M.J., et al., "Laser Guidance and Trapping of Mesoscale Particles in Hollow-Core Optical Fibers", *Physical Review Letters*, Feb. 15, 1999, pp. 1574-1577, vol. 82, No. 7, The American Physical Society.

Renn, M.J., et al., "Optical-dipole-force fiber guiding and heating of atoms", *Physical Review A*, May 1997, pp. 3684-3696, vol. 55, No. 5, The American Physical Society.

Renn, M.J., et al., "Particle manipulation and surface patterning by laser guidance", *Journal of Vacuum Science& Technology B*, Nov./Dec. 1998, pp. 3859-3863, vol. 16, No. 6, American Vacuum Society.

Renn, M.J., et al., "Particle Manipulation and Surface Patterning by Laser Guidance", submitted to EIPBN '98, Session AM4.

TSI Incorporated, "How A Virtual Impactor Works", www.tsi.com.

Vanheusden, K., et al., "Direct Printing of Interconnect Materials for Organic Electronics", *IMAPS ATW, Printing an Intelligent Future*, Mar. 8-10, 2002, pp. 1-5, Lake Tahoe.

Sobeck, et al., "Technical Digest: 1994 Sold-State Sensor and Actuator Workshop", 1994, p. 647.

*Webster's Ninth New Collegiate Dictionary*, Merriam-Webster, Inc., Springifled, MA. USA,(1990),744.

* cited by examiner

DIRECT WRITE™ SYSTEM

CROSS-REFERENCES TO RELATED PATENT APPLICATIONS & CLAIMS FOR PRIORITY

This application is a continuation in part of application Ser. No. 10/060,960, filed 30 Jan. 2002, abandoned, which is a continuation in part of applications Ser. No. 09/584,997, filed 1 Jun. 2000, now U.S. Pat. No. 6,636,676, and Ser. No. 09/408,621, filed 30 Sep. 1999, abandoned, Ser. No. 09/408,621 further claims priority from provisional application 60/102,418 filed 30 Sept. 1998.

Additionally, related International Patent Application Number PCT/US99/22527, filed 30 Sep. 1999, claims priority from provisional application 60/102,418.

FEDERALLY SPONSORED RESEARCH OR DEVELOPMENT

The invention described below was developed using funds from Government Contract No. N00014-99-C-0243 issued by the U.S. Office of Naval Research. Under the terms of the Contract, the Contractor and Assignee, the Optomec Design Company, of Albuquerque, N. Mex., retains rights in the Invention in accordance with Section 52.227-11 of the Federal Acquisition Regulations (Patent Rights-Retention by Contractor, Short Form).

FIELD OF THE INVENTION

The present invention relates generally to the field of precisely depositing a selected material on a substrate. More specifically, one embodiment of the present invention relates to methods and apparatus for generating discrete particles from a source material, creating parallel streams of discrete particles, and then guiding them onto a substrate to form a planar, conformal or three-dimensional feature on the substrate.

BACKGROUND OF THE INVENTION

Many industrial processes require the formation of layers of a material on a substrate or base. These processes include Ink Jet Printing, Photolithography and DuPont's Fodel® technology.

Ink Jet Printing

Ink jet printing is one well-known process that can be used to apply a layer of one material on a substrate. In most cases, ink jet printing is employed to place tiny droplets of ink onto a sheet of paper to create text or an image.

One kind of ink jet printer employs "thermal bubble" or "bubble jet" technology, in which ink is heated in a print head that includes hundreds or nozzles or orifices. The high levels of heat generated by resistors built into the print head vaporize the ink, and forms a series of single bubbles of ink which are propelled out of the nozzles toward a sheet of paper. In another kind of ink jet printing, an array of piezo-electric crystals is activated to vibrate and expel ink from a corresponding array of nozzles.

Both types of ink jet printers are remarkably accurate. A typical ink jet print head has 300 to 600 nozzles, and can form dots of many different colors of ink that are as small as 50 microns in diameter. All of the nozzles can be activated at once to produce complex applications of ink on paper that can even approach or match the resolution of conventional silver halide photography.

Although ink jet printing offers a relatively versatile and inexpensive process for applying a material to a substrate, ink jet printing is generally limited to placing exceedingly thin layers of ink on paper or cloth which are essentially two-dimensional. The viscosity ranges for ink jet printing are limited to ranges of one to ten cp. This limited range of viscosity in turn limits the variety of materials which may be deposited.

Photolithography

Photolithography is a purely planar process that is typically used in the semiconductor industry to build sub-micron structures. Photolithography may be used to build features in the 1~100-micron range, but is plagued by many severe limitations:

1) The thickness of the features ranges from 0.01 to 1 microns. As a result, mechanical connections may not be made to layer built using a photolithographic layer.
2) The photolithographic process is purely planar. Photolithographic structures formed on a substrate do not include three-dimensional features having a height of more than one micron.
3) Photo lithographical processes, which use a process of vaporization of the deposited metal, needs to be run in a vacuum chamber at a temperature which supports the high temperature required to vaporize the metal.
4) Finally, photolithography requires a mask.

Fodel® Materials

According to the DuPont Corporation, Fodel® materials incorporate photosensitive polymers in a thick film. Circuit features are formed using UV light exposure through a photomask and development in an aqueous process. Fodel® dielectrics can pattern 75 micron vias on a 150 micron pitch, and Fodel® conductors can pattern 50 micron lines on a 100 micron pitch. Fodel® materials extend the density capability of the thick film process to allow densities typically achievable using more costly thin film processes.

Fodel® is a process in which a thick film is placed on the substrate. A mask is then used to expose areas of the thick film to cure the material. The substrate is then chemically etched to remove the uncured material. The Fodel® process canbe performed in an ambient environment. The limitations to Fodel® are:

1) The Fodel® process is purely planar. No three-dimensional features can be produced.
2) The Fodel® process uses a chemical etching process which is not conducive to all substrates.
3) Like photolithography, the Fodel® requires a mask.
4) The material costs of the Fodel® process are relatively high.
5) The Fodel® process is limited to features larger than 50 microns.

Other techniques for directing a particle to a substrate involve the use of lasers to create optical forces to manipulate a source material. "Optical tweezers" allow dielectric particles to be trapped near the focal point of a tightly focused, high-power laser beam. These optical tweezers are used to manipulate biological particles, such as viruses, bacteria, micro-organisms, blood cells, plant cells, and chromosomes.

In their article entitled *Inertial, Gravitational, Centrifugal, and Thermal Collection Techniques,* Marple et al. disclose techniques which may be used to collect particles for subsequent analysis or for particle classification.

TSI Incorporated describes how a virtual impactor works on their website, www.tsi.com.

Another method for applying a source material to a substrate is described in a co-pending and commonly-owned U.S. patent application Ser. No. 09/584,997 filed on Jun. 1, 2000 and entitled *Particle Guidance System* by Michael J. Renn. This Application discloses methods and apparatus for laser guidance of micron-sized and mesoscopic particles, and also furnishes methods and apparatus which use laser light to trap particles within the hollow region of a hollow-core optical fiber. This invention enables the transportation of particles along the fiber over long distances, and also includes processes for guiding a wide variety of material particles, including solids and aerosol particles, along an optical fiber to a desired destination.

The co-pending Application by Renn describes a laser beam which is directed to an entrance of a hollow-core optical fiber by a focusing lens. A source of particles to be guided through the fiber provides a certain number of particles near the entrance to the fiber. The particles are then drawn into the hollow core of the fiber by the focused laser beam, propagating along a grazing incidence path inside the fiber. Laser induced optical forces, generated by scattering, absorption and refraction of the laser light by a particle, trap the particle close to the center of the fiber and propels it along. Virtually any micron-size material, including solid dielectric, semiconductor and solid particles as well as liquid solvent droplets, can be trapped in laser beams, and transported along optical fibers due to the net effect of exertion of these optical forces. After traveling through the length of the fiber, the particles can be either deposited on a desired substrate or in an analytical chamber, or subjected to other processes depending on the goal of a particular application.

The problem of providing a method and apparatus for optimal control of diverse material particles ranging in size from individual or groups of atoms to microscopic particles used to fabricate articles having fully dense, complex shapes has presented a major challenge to the manufacturing industry. Creating complex objects with desirable material properties, cheaply, accurately and rapidly has been a continuing problem for designers. Producing such objects with gradient or compound materials could provide manufacturers with wide-ranging commercial opportunities. Solving these problems would constitute a major technological advance, and would satisfy a long felt need in the part fabrication industry.

SUMMARY OF THE INVENTION

The Direct Write™ System provides a maskless, mesoscale deposition device for producing continuous, collimated, parallel streams of discrete, atomized particles of a source material which are deposited on a substrate. Unlike ink jet printers and conventional photolithographic deposition equipment, the present invention can manufacture planar, conformal or three-dimensional surfaces. One embodiment of the present invention is extremely accurate, being capable of using 1 μm droplets to form features as small as 3 μm. The invention is also capable of delivering one billion particles per second to a substrate at scan rates of one meter per second. In addition to being able to deposit a wide variety of inorganic materials such as metals, alloys, dielectrics and insulators. The present invention may also be used to manipulate oraganic and biological entities in droplets such as enzymes, proteins and viruses.

In an alternative embodiment, the invention may also comprise a virtual or cascade impactor to remove selected particles from a stream of gas to enhance deposition.

An appreciation of other aims and objectives of the present invention may be achieved by studying the following description of preferred and alternate embodiments and by referring to the accompanying drawings.

A BRIEF DESCRIPTION OF THE DRAWINGS

FIG. 1 is a schematic depiction of one of the preferred embodiments of the present invention, which utilizes an energy source and a flow of gas to direct particles toward a substrate.

FIG. 2 is a schematic illustration of an alternative embodiment of the invention, which includes a hollow core optical fiber.

FIG. 3 reveals some details of an aerosol chamber, which is used to create discrete particles of a source material.

FIG. 4 portrays a compressed air jet.

FIG. 5 offers another view of one of the preferred embodiments of the invention.

FIG. 6 supplies a schematic depiction of cascade impaction.

FIG. 7 provides a schematic view of a virtual impactor, while FIG. 8 shows virtual impactors in series.

FIG. 9 supplies a view of particle sorting at an atomization unit and virtual impactors in series.

FIG. 10 is a schematic of one of the preferred embodiments of the invention.

FIG. 11 depicts the flow of an aerosol stream and sheath gas.

FIG. 12 presents two graphs showing beam diameter and its dependence upon aerosol and sheath flow rates.

FIG. 13 is an image of a spiral formed with the present invention.

FIGS. 14, 15 and 16 are images of products deposited using the present invention.

FIG. 17 is a graph showing core height versus distance.

A DETAILED DESCRIPTION OF PREFERRED & ALTERNATIVE EMBODIMENTS

I. Direct Write™ Methods & Apparatus

FIG. 1 presents a a schematic view of one of the preferred embodiments of the Direct Write™ System, which comprises methods and apparatus for maskless, mesoscale deposition of a source material on a substrate. Unlike many previous deposition systems which are restricted to the formation of planar layers on a flat substrate, the present invention is capable of forming a wide variety of planar, non-planar, conformal or three-dimensional features on a substrate having virtually any profile or topography.

In one embodiment, the invention comprises a source of material 10 contained by an enclosure 11. Although the a preferred embodiment generally includes a source material in liquid form, the source may comprise any aggregation, mixture, suspension or other combination of any materials in any physical phase. The source of material 10 is contained in a vessel, pool, volume or chamber which is coupled to or in communication with an atomizer 12. In general, the atomizer 12 is responsible for reducing or dividing the source material into discrete particles. The size of the discrete particles may be controlled by the interaction of the physical properties of the source material and/or the atomizer. Any device or means which forms relatively smaller particles from larger particles, from a reservoir of fluid, or from a solid mass may function as the atomizer 12. In this Specification and in the Claims that follow, the term "particle" generally refers to discrete portions of a material or materials which have been rendered from a more extensive supply. Various embodiments of the invention, the atomizer 12 may comprise a device that utilizes an ultrasound or pneumatic device, or that employs a spray process, forms an aerosol or condenses particles from a vapor.

The invention includes some means to apply force 14 to the discrete particles of source material 10 which are produced by the atomizer 12. One of the preferred embodiments of the invention utilizes a carrier gas as a force application means to propel the particles. The typical carrier gas flow rates range from one to ten liters per minute. The preferred type of carrier gas is a gas which does not react adversely to the material which is deposited on the substrate. Nitrogen, argon and helium are excellent carrier gases.

FIG. 1 exhibits another embodiment of the invention, which employs a laser and a lens 13 to direct optical energy into a cloud of discrete particles produced by the atomizer 12. This optical energy propels the particles in a desired direction of flight.

Alternative embodiments may incorporate some other energy source to apply force to the particles. Any device which imparts energy to control the direction and speed of the particles could be used in the invention, including devices which generate heat or which produce electromagnetic or other fields that are capable of controlling a stream of particles.

In addition to a means to apply force 14 to the discrete particles, the invention utilizes some means of collimation 16 to control, regulate or limit the direction of flight of the discrete particles. In one embodiment, a hollow column of co-flowing air surrounds the stream of particles, forming a barrier or sheath of gas 16 that guides the particles as they travel from the force application means 14 toward a substrate 18. This collimating gas 16 exerts radial forces on the stream of particles to restrict and focus their movement toward the substrate 18. The sheath gas stream may be produced from a pressurized system. The sheath gas moves through a nozzle that is specifically designed to entrap and focus the gas stream which carries the particles. Different geometric designs of the sheath gas orifices enable larger or smaller deposition areas.

In alternative embodiments of the invention, the collimation means 16 may comprise an aperture in a thin sheet, or a hollow core optical fiber.

In this Specification and in the Claims that follow, the term "substrate" refers to any surface, target or object which the particles strike or on which they are deposited. The substrate may be flat or generally planar, or may be characterized by a complex three-dimensional profile. In the various embodiments of the invention, the Direct Write™ apparatus may utilize a deposition assembly which moves over a stationary substrate, or may employ a deposition assembly which remains fixed while the substrate moves.

The invention may be used to deposit on virtually any substrate material. In specific embodiments of the invention, the substrate material comprises green tape ceramic, printed circuit boards, MEMS, flexible circuits formed on Kapton™ or Mylar™, clothes fabrics, glass or biologic materials.

Figure 3:
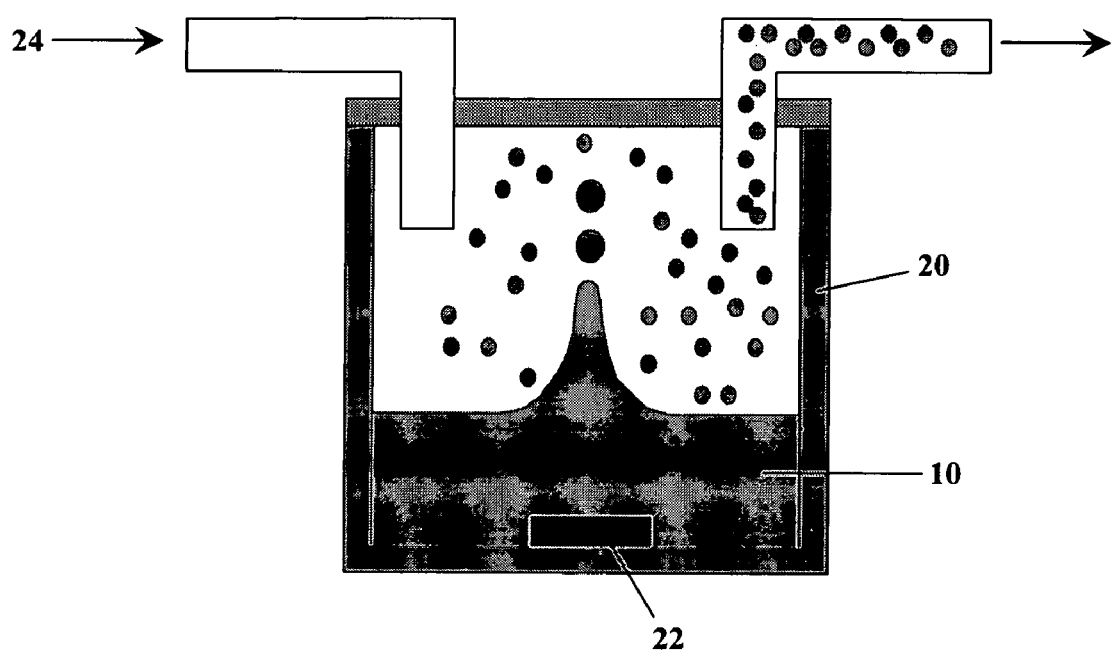
Figure 4:
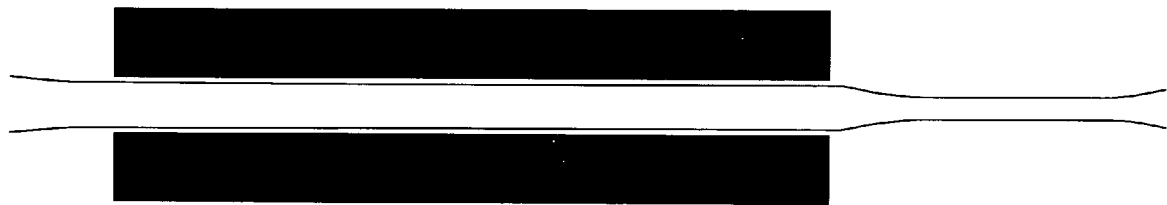
Figure 5A:
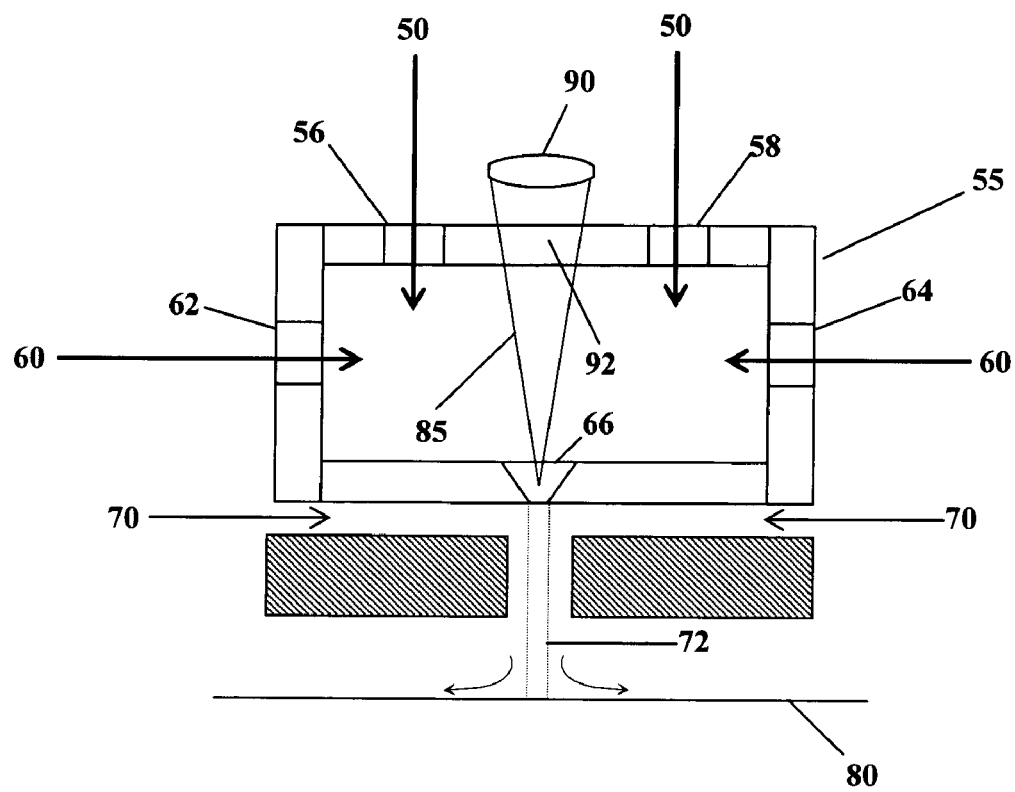
Figure 5B:
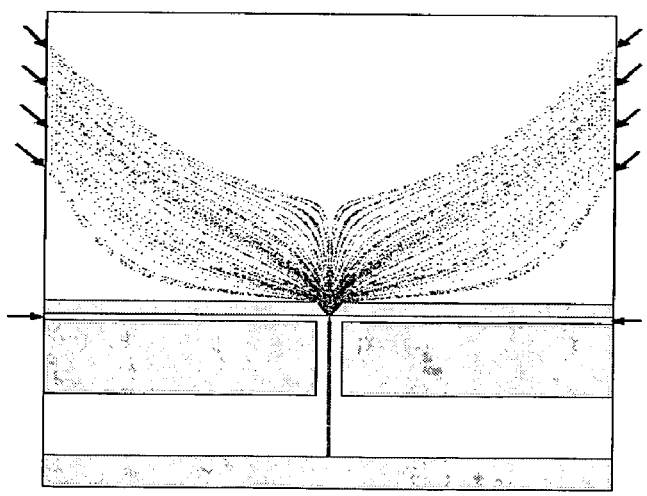
Figure 6:
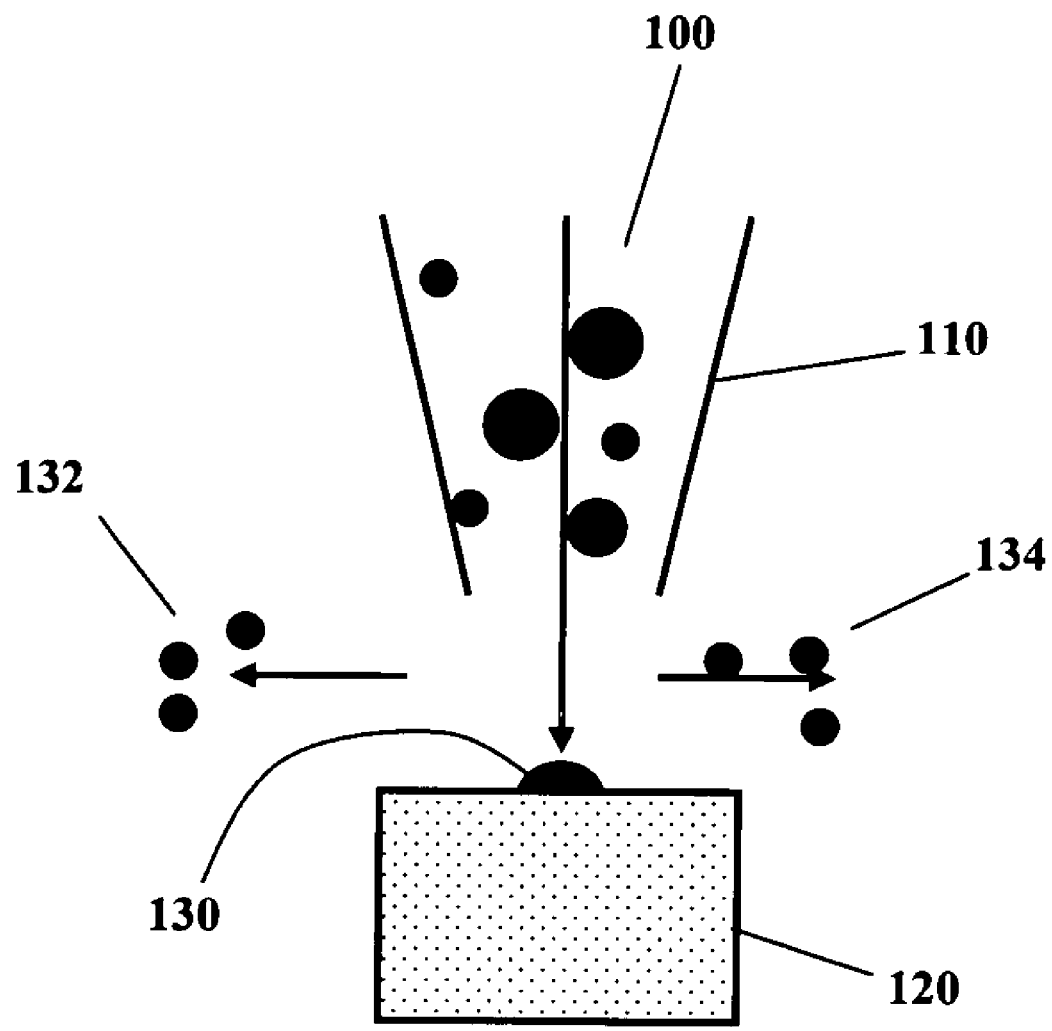
Figure 7:
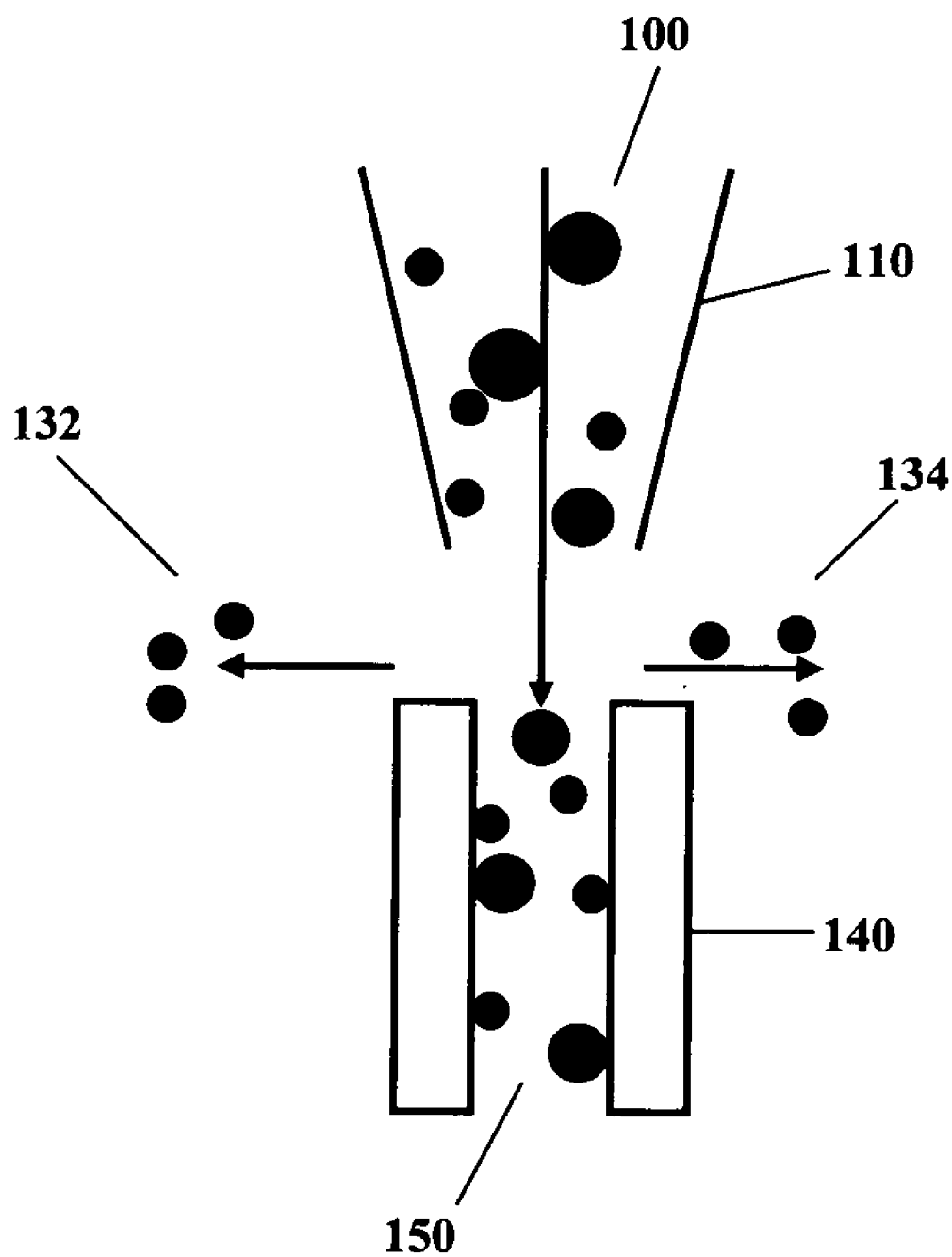
Figure 8:
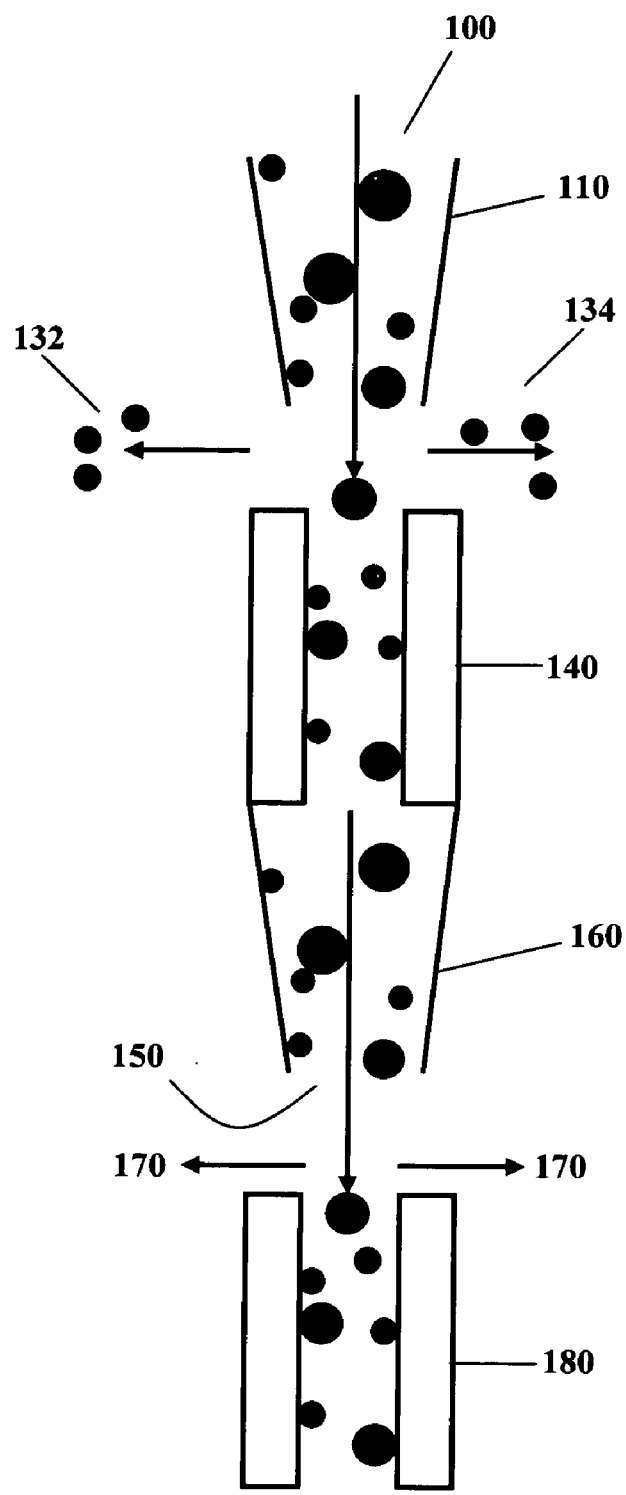
Figure 9:
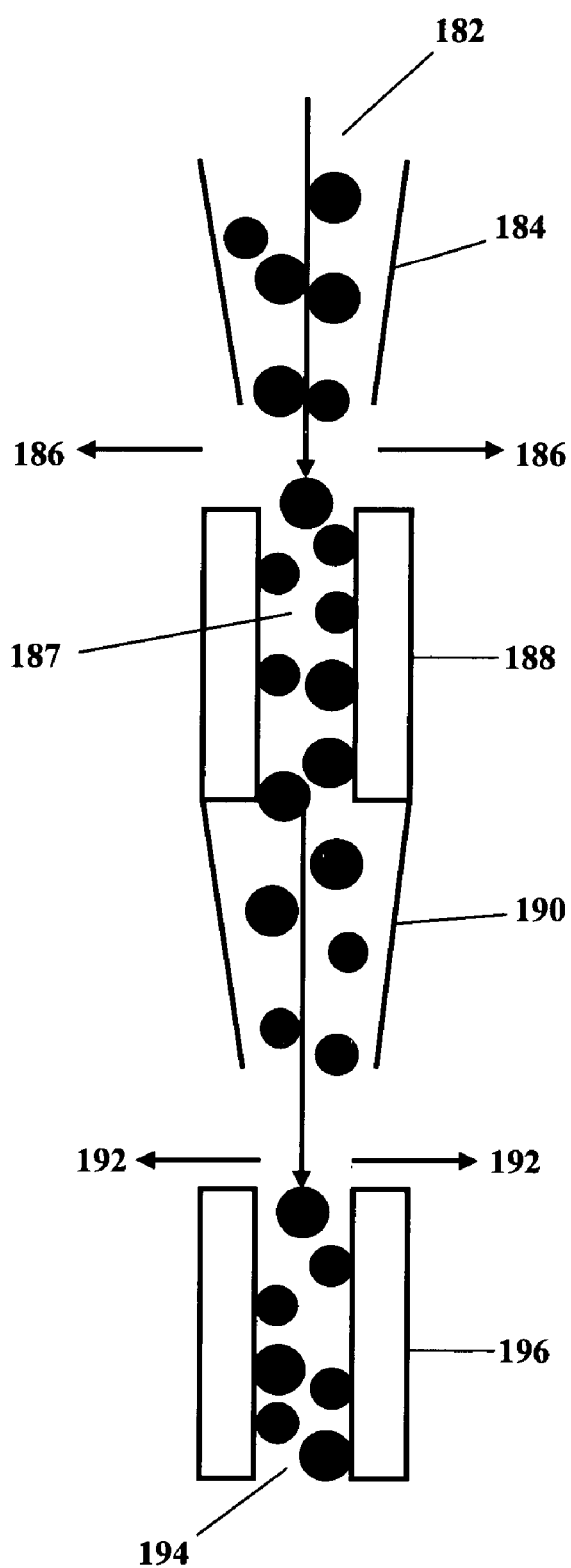
Figure 10:
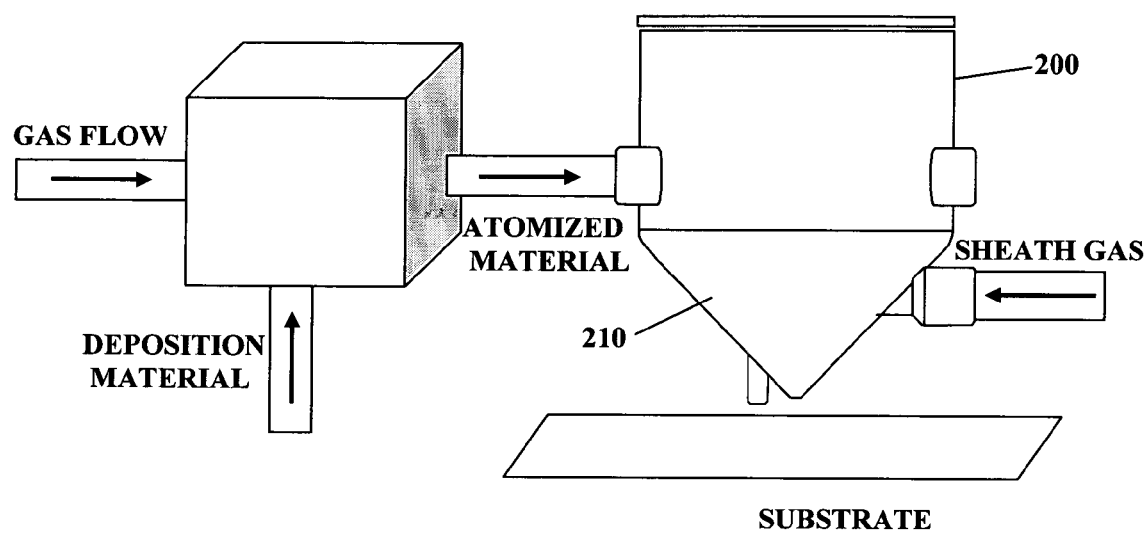
Figure 11:
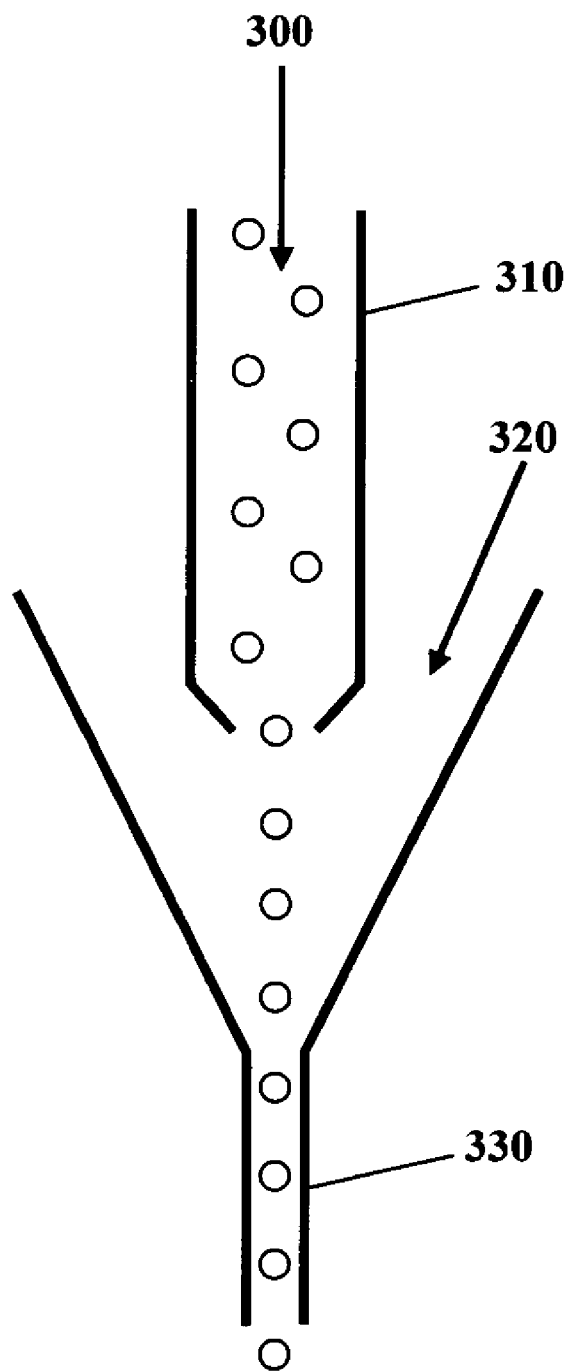
Figure 12:
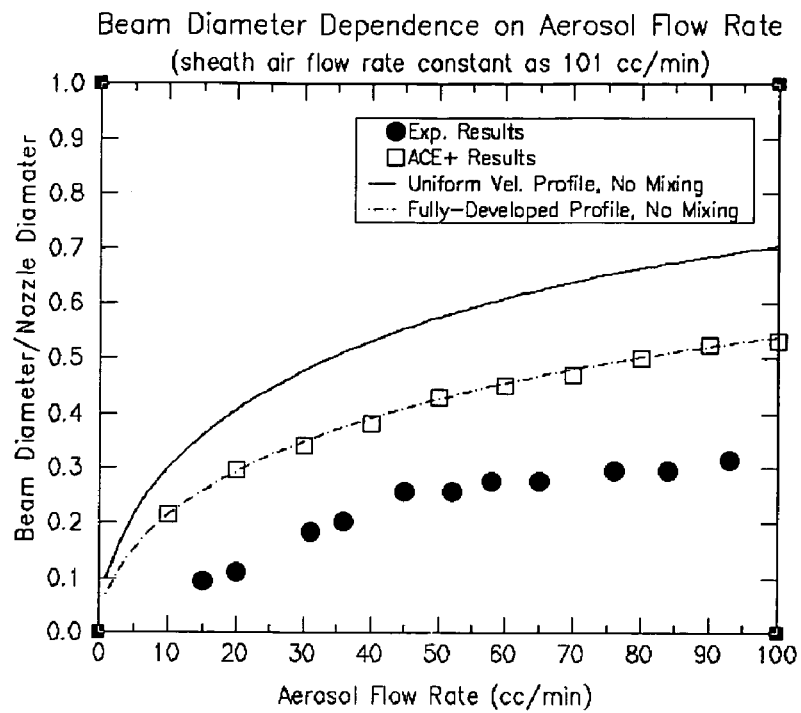
Figure 12:
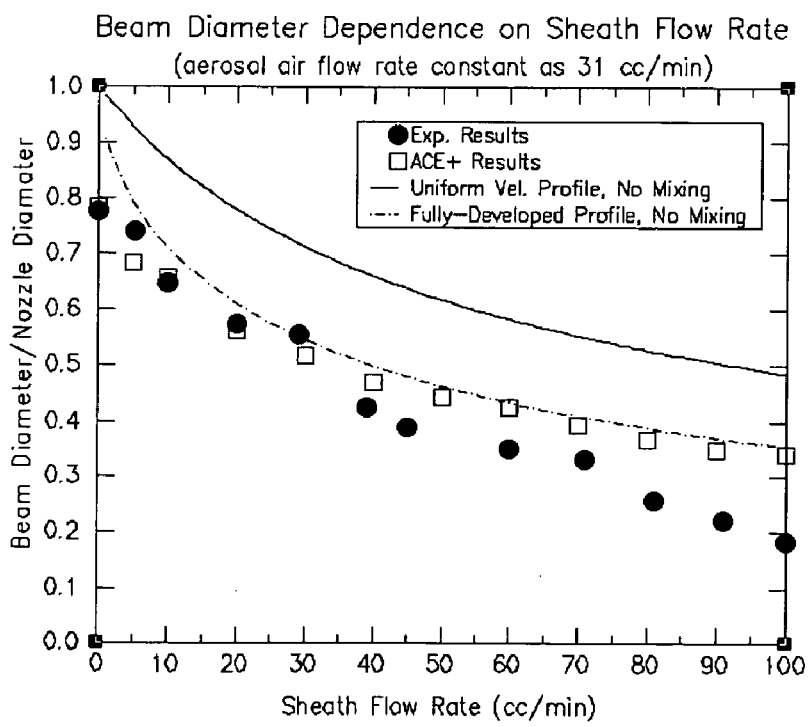
Figure 13:
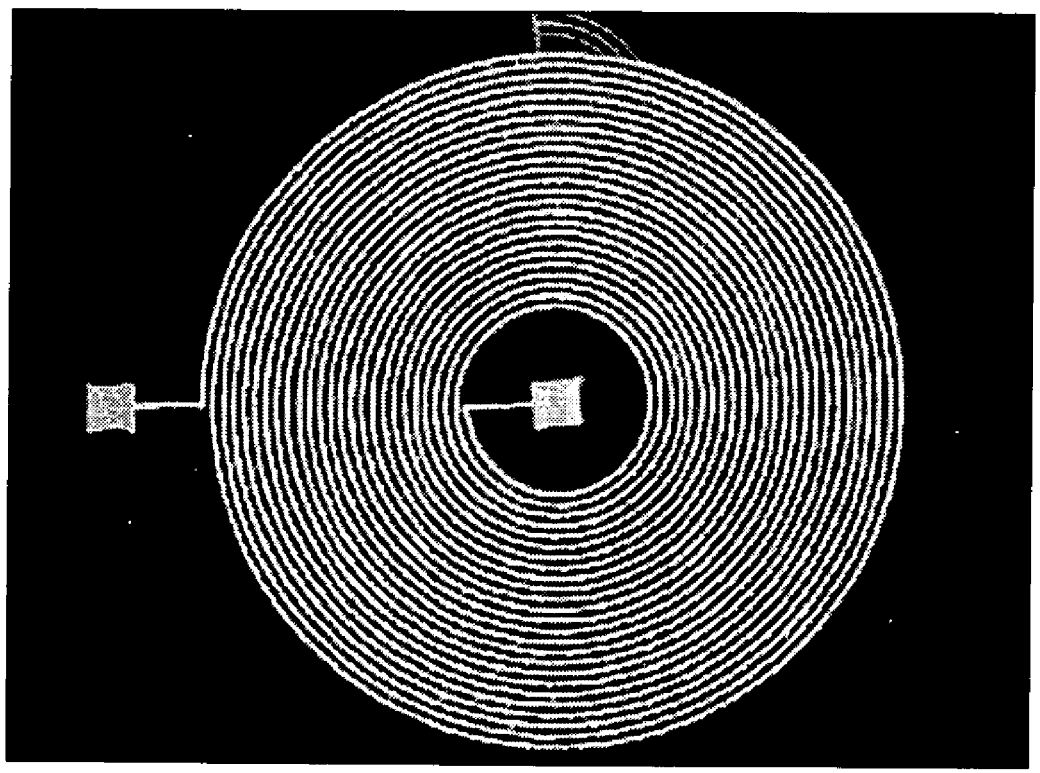
Figure 14:
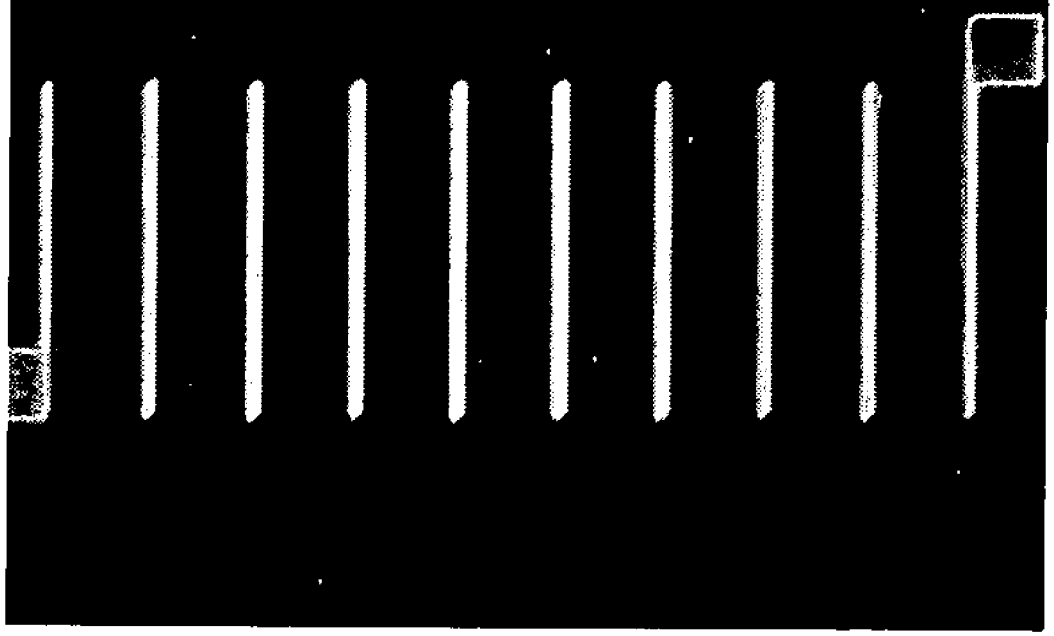
Figure 15:
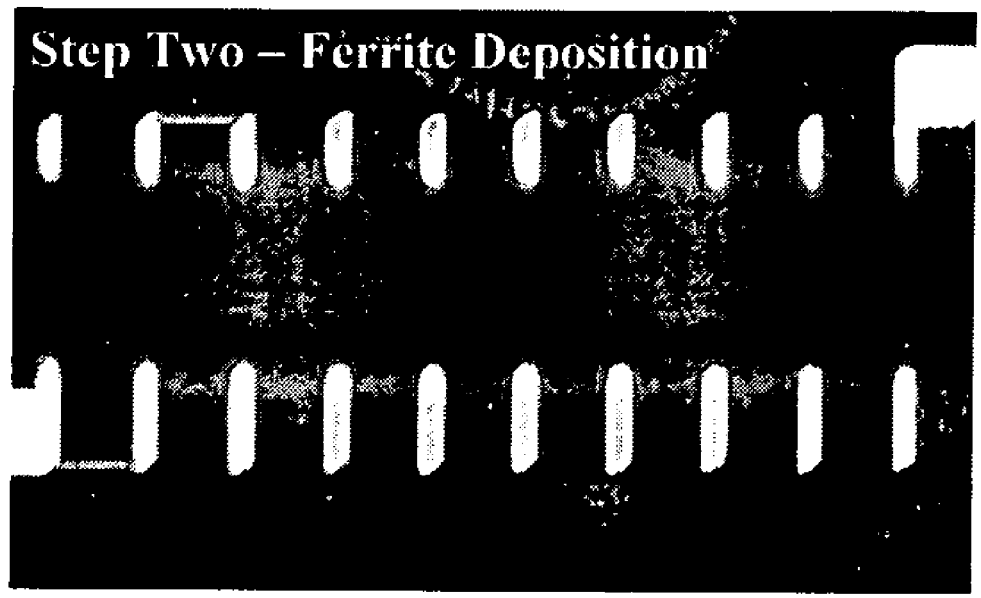
Figure 16:
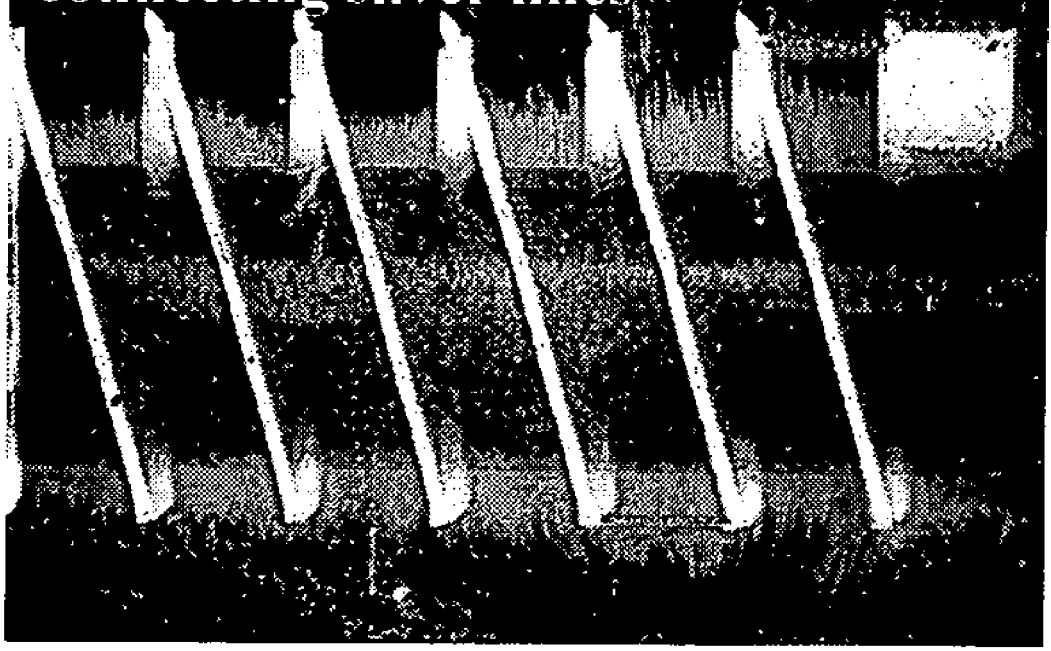

The present invention offers a superior deposition device compared to prior, conventional techniques such as inkjet printing. The Direct Write™System provides a versatile tool for a wide variety of industrial and biomedical applications, and offers the following highly beneficial features:

Maskless
Performed in an Ambient Environment
Three-Dimensional or Conformal:
Manufacture Features having Depth of 1~100 Microns
High Velocity (~10 m/s)
Variable Beam Diameter (10 µm)
High Throughput (~$10^9$ $s^{-1}$ in 100 µm beam)
Reduced Clogging
Long Working Distance (~few cm)
Deposition of Materials with Viscosities Ranging from 1~10,000 cp
Simultaneous Laser Treatment Unlike ink jet print heads, which produce droplets one at a time to produce a single serial stream of droplets from each print head orifice, the Direct Write™ System is capable of producing continuous, parallel streams of discrete particles for deposition. By controlling the viscosity of the atomized particles, the present invention is capable of depositing three-dimensional features which adhere to the substrate without running. The viscosity may be controlled by thinning the material with a solvent, by changing the fundamental design of the material, or by changing the temperature of the material or of the chamber containing the particles. In an optional feature of the invention, the particles may undergo a physical or chemical change before deposition to enhance the characteristics of the final deposited material on the substrate.

A heating process may be employed to change the physical properties of the material. In one embodiment, drops of solvent which hold the particles of material to deposit are removed.

The present invention also provides benefits which are not achievable by photolithographic processes, which require expensive masks which are hard to change, and which are limited to a flat substrate. One embodiment of the invention may be implemented at a relatively low range of temperatures.

The present invention is capable of depositing materials at room temperature. Many of these materials can cure at room temperature. One advantage offered by the invention is the ability to lay down materials in the mesoscopic range (from 1 to 100 microns). If the material needs a thermal post treatment, the deposition can be followed with a laser treatment. The laser beam provides a highly localized thermal and photonic treatment of the material. The laser beam is capable of treating only the deposited material after deposition without affecting the underlying substrate.

The deposition process may involve multiple layers of source material, or may involve immiscible materials. Unlike other previous deposition systems, the present invention may be practiced in an uncontrolled atmosphere.

Unlike some other previous deposition devices, the present invention allows for a variety of substrate treatments during the deposition process. Alternative embodiments of the invention include capabilities for heating the substrate by laser illumination or by increasing the ambient temperature. The substrate may also be cooled during deposition by reducing ambient temperature. Other alternative treatment steps may include photoactivation with a laser, irradiation with infrared light, or illumination with an arc lamp. Another substrate treatment comprises a washing or rinsing process.

FIG. 2 is a schematic illustration of an alternative embodiment of the invention, which includes a hollow core optical fiber 19. The invention has the following features:

Small droplets (~1 μm);

Dense aerosols (~$10^{16}$ $m^3$);

Accuracy to 3 μm;

Single particle to $10^9$ particles/s;

Throughput to 0.25 $mm^3$/s;

Low power (~50 mW);

High scan rate (~1 m/s);

Dense, conductive materials (ρ~233 bulk).

FIG. 3 reveals some details of an aerosol chamber 20, which is used to create discrete particles of a source material. Ultrasonic transducer 22 atomizes material 10 in aerosol chamber 20. Aerosolized particles of material 10 are then entrained in gas flow 24 and forced out of aerosol chamber 20 by gas flow 24, preferably to the delivery system. Gas flow 24 optionally comprises air. Some features of the aerosol chamber of the Present invention include:

Small droplets (~1 μm, 1 fL);
Dense aerosols (~$10^{16}$ $m^3$);
100 μL minimum sample;
All solids, all precursors, or solid/precursor mixtures;
Precursor based alloys with atomic scale mixing;
Organic and biological entities in droplets (enzymes, proteins, virus, etc.).

FIG. 4 portrays a compressed air jet 26 having the following features:

Particulate in Suspension;
Large Particles (1–30 μm);
High Viscosity Fluids;
Particles+Precursor binder;
Animal Cells+Media;
Bacteria;
Virus.

FIG. 5(*a*) depicts a schematic for one of the preferred embodiments of the invention. In this embodiment, particle laden air 50 enters deposition head 55 through norts 56, 58. Sheath air 60 enters through ports 62, 64 to surround particle laden air 50. The air/particle stream then is narrowed as it passes through nozzle 66. Coflowing air 70 then surrounds the stream, forming jet 72 which impinges on substrate 80. Laser beam 85 passes through lens 90 and glass window 92 for processing the particles in jet 72 or on substrate 80. FIG. 5(*b*) depicts a computer simulation of particle flow for an alternative embodiment in which the particle laden air enters the deposition head through ports in the side of the deposition head.

Precursors

The present invention also offers the ability to simultaneously deposit solid particles and liquid "precursors," where the liquids serve to fill the gaps between solid particles. In general, a precursor is any material that can be decomposed thermally or chemically to yield a desired final product. Coalescence of liquid precursors on the substrate and subsequent decomposition by laser heating to form a final product on the substrate and sintering of the deposited material by laser, or chemical binding are additional techniques made possible by the invention. A number of precursor and particulate materials may be used to create composite structures having gradient chemical, thermal, mechanical, optical and other properties.

II. Removal of Particles from a Stream of Gas

There are several well-known technologies that involve the removal of particles from a stream of gas. Two of the more common methods are known as cascade impaction and virtual impaction. The most widely used are the inertial classifiers.

Cascade Impaction

Cascade impaction is a method which may be used to sort larger particles from smaller ones. FIG. 6 presents a pictorial description of the cascade impaction method. A gas stream 100 is produced to carry particles of material of varying size and mass. This gas stream is projected through a nozzle 110 towards an impaction plate 120. In a steady state condition, the gas produces streamlines above the impaction plate. Particles with larger mass and greater momentum are projected through these streamlines, and strike the impaction plate directly at impaction point 130. These particles accumulate on the surface of the impaction plate. Particles with smaller mass and less momentum are carried in the streamlines, and generally do not strike the impactor plate. These smaller particles continue to travel in the gas stream 132, 134, commonly know as the "major flow."

By optimizing the geometry of the nozzle and impaction plate relative to the gas stream, a method to sort large particles from small ones may be implemented using the cascade impactor. The smaller particles may be collected, or utilized in a down stream process. As shown in FIG. 6, the larger particles are "lost" from the gas stream as they accumulate on the surface of the impactor plate. These larger particles can not be utilized in any down stream processes.

Virtual Impaction

FIG. 7 supplies a schematic view of a virtual impactor. Virtual impaction uses the same principles as cascade impaction, except that an orifice 140 allows the larger particles to continue down stream in a "minor flow" 150. The fundamental difference between a cascade and virtual impactor is that the larger particles are preserved in the gas stream using the virtual impactor. Thus the larger particles may be utilized by employing virtual impaction.

Applications of Virtual and Cascade Impaction

These two impaction methods were developed for the spraying of particles without any consideration to the density or number of particles in the gas stream. If small particles are desired, then a cascade impactor maybe used to eliminate the large particles. If large particles are desired, then a virtual impactor may be used to eliminate the small particles. Typical uses of cascade and virtual impactors arc particle size sorting and sampling.

Gas Removal Process

The present invention enables the direct write of most electronic materials (conductors, resistors, dielectrics). In this application, an atomizer emits a gas stream laden with various size particles. The gas stream from the atomizer flows at the rate of approximately 5 liters per minute. This gas stream flows through a virtual impactor, which strips off 4.95 liters per minute of gas. The remaining gas stream ultimately flows through the deposition head at a rate of 0.050 liters per minute. In this process, it is desirable to strip off only gas, and have the electronic component particles generated at the atomizer be contained in the flow which ultimately impacts the substrate. The highest possible number of particles in the gas stream is the most desirable. The gas stream density can be defined as the number of particles within a given volume of gas.

Gas Stream Density=Number of Particles/Unit of Carrier Gas

In this equation, the number of particles is determined by the atomization method. Once this method is selected, the number of particles generated is fairly constant and cannot be dramatically increased. To increase the gas stream density, it is desirable to remove excess gas from the carrier stream without removing the deposition particles. Stripping off excess gas while carrying the same number of particles would increase the particle density.

The present invention includes several methods to increase the gas stream density.

Method 1—A Series of Virtual Impactors FIG. 8 shows one method of densifying the gas stream. The first method involves placing a number of virtual impactors in series to strip off the excess gas. The first impactor strips off both carrier gas and the smaller particles. After minor flow 150 is passed through second nozzle 160, the second virtual impactor (and any number after) strips off only carrier gas in second major flow 170, 172 while the larger particles flow through second orifice 180. In this method, a series of virtual impactors can be used to densify the gas stream by stripping off more and more of the carrier gas.

Method Two—Particle Sorting at the Atomizing Unit

FIG. 9 shows a second method to densify the gas stream. This method employs a virtual impactor (not shown) at the exit of the atomizing unit. This impactor would be used to sort the particle stream prior to introduction into the gas stripping virtual impactors so that only large particles remain entrained in entering particle/gas stream 182. FIG. 9 depicts two air-stripping virtual impaction stages. The first stage comprises nozzle 184; only carrier gas is removed in first maior flow 186. Initially densified particle/gas stream 187 then passes through first orifice 188 and second nozzle 190, after which more carrier gas is stripped off in second maior flow 192. Further densified particle/gas stream 194 then passes through second orifice 196. Both major flows strip off carrier gas only; no particles are removed from the particle/gas streams. Essentially, all of the particles in the gas stream would be sized to permit a direct pass through each gas stripping virtual impaction stage.

III. A Preferred Embodiment of the Invention & Its Applications

One embodiment of the present invention includes a process for producing features in the mesoscale range, i.e., from 1 to 100 microns, which avoids many of the problems that plague prior thick film and thin film technologies. Thick film techniques typically use a screen print process to produce features down to about 100 microns wide. Thin film techniques employ masks and photoresists to produce submicron features, and are costly and complex.

The present invention is capable of depositing electronic materials onto low-temperature, planar and non-planar substrates, without the use of masks or photoresistive deposits. Simpler and less expensive than thin-film techniques, the present invention can deposit 25-micron lines of inorganic (and organic) materials onto polymer, glass, silicon, and alumina and other ceramic substrates. One embodiment of the invention, Maskless Mesoscale™ Materials Deposition (M3D™), deposits aerosolized particles as small as 20 nanometers in diameter using aerodynamic focusing. The particle beam may be focused down to a 25-micron diameter. Approximately one billion particles per second can be deposited, with accuracies on the order of 25 microns. After the deposition process is completed, the material is decomposed or densified to produce the desired electrical and mechanical properties.

Typical thick film techniques deposit materials that must be fired well above 400° C., limiting the process to high-temperature substrates. However, the present invention is capable of depositing materials onto low-temperature substrates, and then using thermal or laser processing to obtain the desired properties by virtue of the initial precursor chemistry or localized laser heating. Specifically, the present invention can deposit electronic materials onto low-cost polymer substrates that cannot withstand high-temperature oven fires.

The present invention allows manufacturers to integrate many active and passive components into one compact, lightweight, and conformal electronic system. Surface-mount resistors, capacitors, and inductors occupy most of the surface of a typical PWB. The present invention can embed these components into the board. By embedding components and reducing interconnect pitch and line widths, a reduction in area of approximately 70 percent may be obtained for today's standard PWB. As a specific example, this capability will allow PWB designers to populate boards with the components required by next-generation wireless devices. Additionally, the present invention can precisely deposit metal onto non-planar surfaces for flex circuit manufacturing applications. Other applications include bond-pad redistribution, rework and repair of electronic circuitry, custom deposition for under-bump metallization, and custom bump fabrication for flip-chip interconnects.

One embodiment of the invention includes a direct-deposition process which maybe employed to produce electronic structures down to the 25-micron (Mesoscale) dimension range. This process can deposit a variety of commercial and custom electronic materials onto low-temperature substrates without masks or other thin-film equipment. This flexible, non-contact process writes over rough, curved, or even random surface morphologies.

This embodiment starts with the circuit designers CAD file. Proprietary software algorithms are used to translate the *.dxf CAD directly to a machine tool path. The next step is the deposition process where metal or ceramic inks, particulate suspensions, or commercial pastes are aerosolized and then focused into a deposition flow stream and onto a substrate as shown in FIG. 10. FIG. 10 reveals one embodiment of a Flow Guided Deposition System, in which liquid inks and pastes are atomized to form a dense aerosol of droplets and particulates. The aerosols are entrained in a gas flow and fed into a proprietary deposition head 200. The co-flowing sheath gas creates the aerodynamic forces to focus the aerosol stream. Finally, the streams are directed through nozzle 210 onto a substrate and mesoscale devices directly written. The current line width capability is down to about 25 microns, and the thickness capability is up to 100's of microns.

Once the materials are deposited, they are usually post-treated to produce desired electrical and mechanical properties. This can be done either thermally or by a laser processing step depending upon the deposition material and substrate combination being used.

Deposition

The parameters which are controlled during deposition are: the line widths, line edge quality, stand-off height of the nozzle, and mass deposition flow rate.

Aerosolization

In generating the aerosol of the start material, colloids, precursor inks, or commercial pastes are atomized to form a dense cloud of micron-sized droplets and solid particles. One requirement of the material to be deposited is a uniform colloidal particle size distribution within the liquid suspension. Commercial pastes will generally meet this requirement satisfactorily. This most often is of concern when depositing proprietary or development materials, since the various sized particles will atomize with different efficiencies. This leads to preferential atomization and deposition of smaller particles. Settling of the deposited material can create layers of particle size distribution. On the other hand, small particles have relatively low inertial momentum. As described below, this leads to low Stokes number and poor line edge definition on the substrate. As a result of the competing effects, the preferred start materials are either uniform colloidal dispersions or pure liquids and the particle/droplet size generated by the atomizer is in the 0.5–3.0 micron size range. The output mist of the current units is of the order of one billion particles/second. This is also somewhat dependent upon the viscosity of the start material. The current mist generation system can work with materials with viscosity ranges from 1–1000 centipoise. This covers the range of many commercially available pastes, and also gives users the flexibility to work with many custom materials.

Flow-Guided Deposition

The output mist is entrained in a gas flow (aerosol stream), and is fed into the flow-guided deposition head. The mass throughput is controlled by the aerosol carrier gas flow rate. Inside the head, the mist is initially collimated by passing through a millimeter-sized orifice as shown in FIG. 11. FIG. 11 reveals a flow guide head, showing the particle stream, focusing orifice, and the sheath gas flow. The aerosol stream 300 passes through an initial orifice 310 serving as the primary focusing point. Then the sheath gas 320 is annularly fed around the aerosol stream and fed through a second orifice 330 preferably sub-millimeter sized, thus focusing the stream further.

The purpose of the sheath gas is to form a boundary layer that both focuses the particle stream and prevents the particles from depositing onto the orifice nozzle walls. This shielding effect minimizes clogging of the orifices and reduces contamination during change over to a different material. The emergent particle stream, which is now wrapped in the sheath gas, is focused to approximately 20% of the diameter of the second orifice. It has been accelerated to a velocity on the order of 100 meters/second.

As shown in FIG. 12, the particle stream diameter is a function of aerosol and sheath gas flow rates. The theoretical modeling and simulation results are provided by CFD Reseach Corporation. As shown, the beam diameter primarily depends on the sheath gas flow rate and the optimum stream diameter is approximately 5 times smaller than the nozzle orifice diameter. The stream diameter dependence on aerosol flow rate is not strong, but the mass deposition rate is proportional to this parameter.

The beam diameter, and consequently the line width on the substrate, is controlled primarily through the sheath gas flow rate. Increasing the sheath gas flow rate will tighten the deposition beam and create narrower deposition lines. This cannot be increased endlessly since the laminar flow nature of the sheath gas cannot be compromised. As a clear upper limit, the combined sheath and aerosol speed cannot exceed the speed of sound (roughly 300 meters/second).

The deposited feature size is dependent on the diameter of the deposition stream but also on the particle inertial momentum. The particle inertial momentum is conveniently described by the Stokes number:

$$Stk = \frac{\rho_p C_c d_p^2 U}{9 \eta W}$$

where:

$p_p$=particle density $C_c$=slip correction factor $d_p$=particle diameter

U=average gas velocity at the nozzle exi $\eta$=gas viscosity

W=nozzle diameter

Simulations show that particles with high Stokes numbers (>1) tend to maintain a straight line trajectory from the nozzle to the substrate. Particles with low Stokes number predominately follow the gas stream lines. Instead of impacting on the substrate the low Stokes number particles follow the shear flow tangent to the substrate. Under typical conditions nearly all particles 1.0 micron and larger deposit on the substrate, but smaller particles do not. For this reason, the particle generator must produce droplet sizes of order one micron range.

One other factor to attaining good edge definition and minimum line width is the viscosity of deposited material. As in screen printing, the best edge definition and line shape is obtained with high viscosity materials. During the deposition process, the droplets can be partially dried by the sheath gas. This occurs because the sheath gas initially contains negligible amounts of solvent. As the droplets dry the solvent diffuses across the boundary layer between sheath and aerosol streams. During deposition the solvent is swept away in the sheath stream but the dried particles are deposited on the substrate. Passing aerosol stream through a heated tube before feeding it into the deposition head can also facilitate droplet drying. The net effect is to form more viscous, dried materials that do not flow when deposited.

An example of the line definition and feature size achievable using the present invention is shown in FIG. 13, which reveals 35 micron silver lines on a 60 micron pitch deposited on Kapton™. The silver start material is metal organic ink that was atomized, deposited, and finally treated on a hotplate at 200 degrees C. The measured inductance is 3 micro henries. The overall diameter of the coil is 2.0 mm. The start material is silver ink that was deposited and then treated on a 200 degrees C. hotplate to chemically decompose the precursors and densify the silver. In depositing this pattern, the substrate was translated beneath the deposition head at a speed of 10 mm/s. Because the particle velocities approach 100 m/s, the substrate translation speeds can be very high. This embodiment deposits material at 0.5 m/s. Greater speeds should be possible with custom translation stages.

As a result of the collimation and high velocity, the small beam diameter is maintained without significant divergence over several millimeters from the orifice. The maximum stand off height of the nozzle to the substrate is controlled by the total gas flow rate (sheath plus aerosol). Higher flow rates increase the particle velocity and Stokes number, consequently higher stand off heights are possible. The large stand off height makes it possible to write over surfaces with significant morphological texturing.

As an example of this, FIGS. 14, 15 and 16 show a three-dimensional ferrite-core inductor that has been built using the present invention. A three-step process used to fabricate a ferrite-core inductor on a Kapton™. Step one is to deposit parallel lines of silver directly onto the Kapton™. Step two is to deposit ferrite and glass powder over the conductors and to densify the powder with a laser. The blue color of the ferrite in the second image is an artifact of the lighting required to bring the image in focus. The final step is to deposit diagonal silver lines over the core, connecting the parallel lines of layer one, to create the coil.

The inductor is build by first depositing parallel lines of silver ink on Alumina. The lines are approximately 100 microns wide, 1 micron thick and 1000 microns in length. The lines are laser treated to form dense, conductive silver wires. These wires are one-half of the conductive traces that will eventually wrap around a ferrite core. Silver contact pads (1000 micron square) are also added in the first layer.

The second step is to deposit a mixture of Manganese-Zinc Ferrite powder and low melting temperature glass over the conductive lines. The powder is densified by scanning a laser across the deposit, which melts the glass. The glass flows around the ferrite particles and forms a dense, connected solid after cooling. The ferrite deposition step is repeated several times to buildup the deposit to about 100 microns. The ferrite line lengths are about 1500 mm long.

The final step is to write conductive traces over the ferrite layer and connect them to the underlying traces. Since the deposition head standoff distance is several mm, it is relatively simple to write over a mm-sized curved surface. The resistance of a typical coil generated using this method is on the order of several ohms. The inductance is 7 micro henries and the Q value is 4.2@1 MHz.

Figure 17:
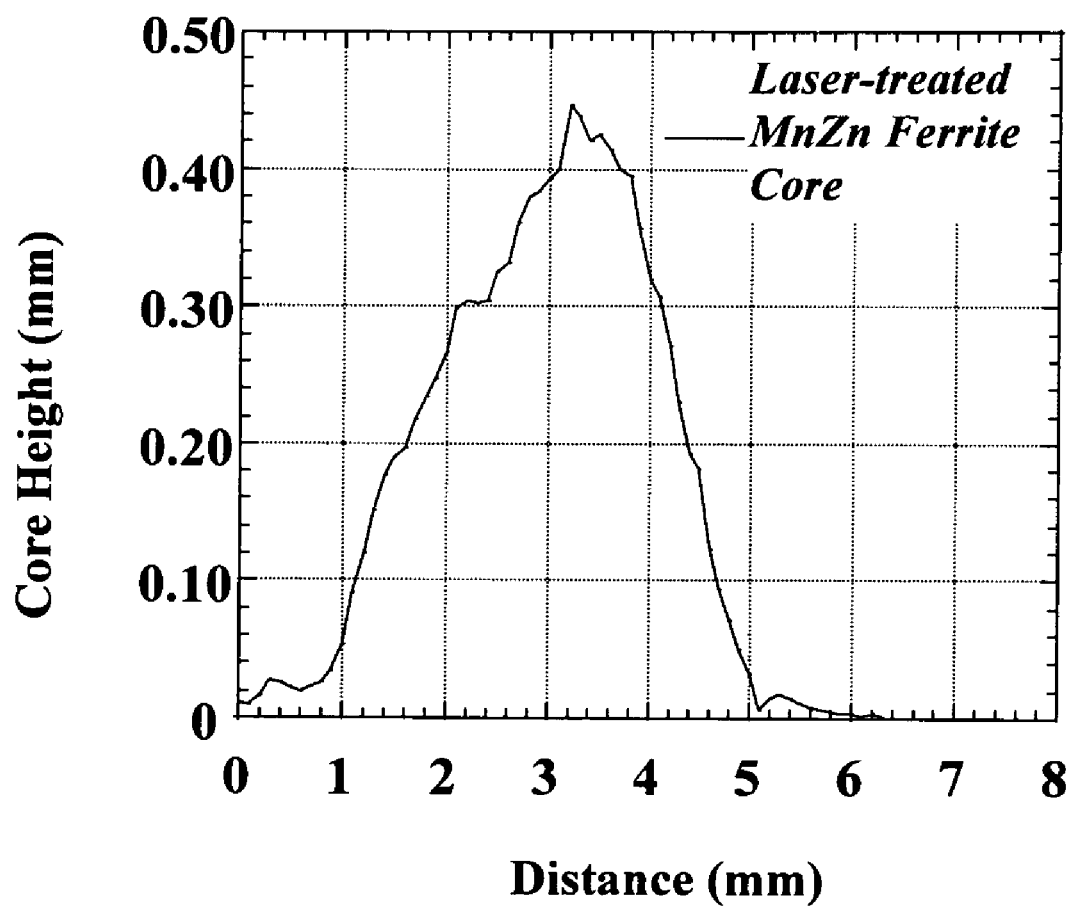

FIG. 17 portrays the typical profile of the deposited ferrite layer. While high gas flow rates have beneficial effects to focusing the particle stream and accelerating the particle to high Stokes number, there are situations where this will not produce the optimal result. When the gas stream impacts on the substrate it creates a significant lateral flow. The lateral flow can cause the particles to be swept away from the substrate feature rather than deposited. This occurs mainly on non-planar substrates when depositing near vertical (or nearly vertical) structures such as channels. When the gas stream hits the vertical wall an asymmetrical lateral flow is established. This flow field carries the particles away from the wall and causes them to deposit some distance away. The solution in practice is to tilt the deposition head relative to the side-wall by at least 20 degrees. In this case contiguous deposition can be achieved over step heights of at least 200 microns.

The present invention comprises a maskless deposition process that fills a niche in the mesoscale regime between thick and thin film. The invention is capable of depositing multiple materials into fine geometries on both planar and curved substrates. The materials can be either commercial pastes or custom, low-fire inks. Laser processing allows the materials to be densified on low-temperature polymers.

The present invention may be applied to a wide range of applications. The ability to deposit fine lines over curved and stepped surface suggests applications in writing interconnect wires between IC chips and PWB. The ability to deposit multiple materials lends to applications in multilayer components as well as to encapsulating components once they are built. The ability to fire materials on low-temperature substrate allows discrete components to be directly written on polymers. These features add up to a tremendous new capability and resource for electronics manufacturers.

CONCLUSION

Although the present invention has been described in detail with reference to particular preferred and alternative embodiments, persons possessing ordinary skill in the art to which this invention pertains will appreciate that various modifications and enhancements may be made without departing from the spirit and scope of the Claims that follow. The various configurations that have been disclosed above are intended to educate the reader about preferred and alternative embodiments, and are not intended to constrain the limits of the invention or the scope of the Claims. The List of Reference Characters which follows is intended to provide the reader with a convenient means of identifying elements of the invention in the Specification and Drawings. This list is not intended to delineate or narrow the scope of the Claims.

LIST OF REFERENCE CHARACTERS

Source material
Enclosure
Atomizer
Force application means
Collimation means
Substrate

What is claimed is:

1. An apparatus comprising:
   a material source for supplying a material to be deposited;
   an atomizer for producing a plurality of discrete particles from said material source;
   a virtual impactor;
   a carrier gas for propelling said plurality of discrete particles generally toward a substrate;
   a coflowing sheath gas which surrounds said carrier gas for controlling the direction of flight of said plurality of discrete particles; and
   a single orifice for narrowing a particle stream comprising said coflowing sheath gas, said carrier gas, and said plurality of discrete particles sufficiently to form a deposited feature comprising a feature size of less than one millimeter on the substrate.

2. The apparatus of claim 1 wherein said coflowing sheath gas forms a boundary layer that prevents said plurality of discrete particles from depositing onto walls of an orifice nozzle.

3. The apparatus of claim 1 wherein said virtual impactor is placed after said atomizer.

4. The apparatus of claim 3 wherein said virtual impactor extracts excess carrier gas without substantially reducing the number of said discrete particles.

5. The apparatus of claim 3 wherein said virtual impactor sorts said plurality of discrete particles by size.

6. The apparatus of claim 3 further comprising two or more virtual impactors placed in series.

7. The apparatus of claim 1 further comprising a laser for processing said discrete particles.

8. A method of direct writing of a material, the method comprising the steps of:

supplying the material to be deposited;

atomizing the material to produce a plurality of discrete particles;

applying a force by employing a carrier gas to propel the plurality of discrete particles generally toward a substrate;

collimating the plurality of discrete particles by surrounding the carrier gas with a coflowing sheath gas to control the direction of flight of the plurality of discrete particles;

subsequently passing the particles through no more than one orifice; and depositing the plurality of discrete particles on the substrate to form a deposited feature comprising a feature size of less than one millimeter.

9. The method of claim 8 additionally comprising the step of sorting the plurality of discrete particles by size.

10. The method of claim 9 wherein the sorting step comprises employing one or more virtual impactors.

11. The method of claim 8 further comprising the step of the coflowing sheath gas forming a boundary layer, thereby preventing the plurality of discrete particles from depositing onto walls of an orifice nozzle.

12. The method of claim 8 further comprising the step of extracting excess carrier gas without substantially reducing the number of said discrete particles.

13. The method of claim 12 wherein the extracting step comprises employing a virtual impactor.

14. The method of claim 8 further comprising the step of placing two or more virtual impactors in series.

15. The method of claim 8 further comprising the step of processing the discrete particles with a laser.

* * * * *

UNITED STATES PATENT AND TRADEMARK OFFICE
Certificate

Patent No. 7,108,894 B2

Patented: September 19, 2006

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Michael J. Renn, Hudson, WI (US); Bruce H. King, Albuquerque, NM (US); Manampathy G. Giridharan, Mason, OH (US); and Jyh-Cherng Sheu, Hsinchu City (TW).

Signed and Sealed this Twenty-fifth Day of September 2012.

STEPHEN D. MEIER
*Supervisory Patent Examiner*
Art Unit 2853
Technology Center 2800